US007257747B2

(12) United States Patent
Song

(10) Patent No.: US 7,257,747 B2
(45) Date of Patent: Aug. 14, 2007

(54) APPARATUS FOR TESTING USB MEMORY AND METHOD THEREOF

(75) Inventor: Jae Myung Song, Kyungki-do (KR)

(73) Assignee: Mirae Corporation, Chunan-Si (KR)

(*) Notice: Subject to any disclaimer, the term of this patent is extended or adjusted under 35 U.S.C. 154(b) by 300 days.

(21) Appl. No.: 11/027,957

(22) Filed: Jan. 4, 2005

(65) Prior Publication Data

US 2005/0216811 A1 Sep. 29, 2005

(30) Foreign Application Priority Data

Mar. 23, 2004 (KR) .................. 10-2004-0019807

(51) Int. Cl.
*G11C 29/00* (2006.01)
(52) U.S. Cl. .................................................. 714/718
(58) Field of Classification Search ............... None
See application file for complete search history.

(56) References Cited

U.S. PATENT DOCUMENTS

| 6,480,801 | B2 | 11/2002 | Chew ...................... 702/122 |
| 2005/0097541 | A1* | 5/2005 | Holland ................... 717/168 |
| 2006/0031609 | A1* | 2/2006 | Buswell et al. ........... 710/62 |
| 2006/0052919 | A1* | 3/2006 | Hong et al. ............... 701/29 |

* cited by examiner

*Primary Examiner*—Christine T. Tu
(74) *Attorney, Agent, or Firm*—Ked & Associates, LLP

(57) ABSTRACT

A test handler which is capable of transporting and testing a plurality of USB memory devices is provided. The handler includes a tray loaded with USB memory devices for testing, and a loading/unloading picker which transfers the USB memory devices from the tray to a shuffle for transport to a test socket. The shuffle moves to insert connectors of the USB memory devices into corresponding USB ports of a test socket for testing, and to extract the connectors from the USB ports after testing. The loading/unloading picker is capable of detecting an orientation of the connectors of the USB memory devices to ensure proper insertion into corresponding USB ports in the test socket.

21 Claims, 9 Drawing Sheets

APPARATUS FOR TESTING USB MEMORY AND METHOD THEREOF

BACKGROUND OF THE INVENTION

1. Field of the Invention

The present invention relates to an apparatus for testing a USB memory and a method thereof. More particularly, the present invention relates to an apparatus for testing a USB memory capable of testing electrical characteristics of a plurality of USB memory devices after completion of assembly thereof, and a method thereof.

2. Background of the Related Art

As illustrated in FIG. 1, in case of a conventional USB (Universal Serial Bus: hereinafter, USB) memory 10, a PCB (Printed Circuit Board, not shown) is mounted inside of a case 2, wherein a USB client chip and a flash memory are electrically connected to the PCB. Moreover, the PCB and a USB connector 1 is electrically connected to the USB client chip.

A plurality of holes 1a are respectively formed on both ends of the USB connector 1 and an insulating member 1b is inserted therein. A plurality of leads (not shown) are formed on the upper surface of the insulating member 1b, wherein the leads are electrically connected to the USB client chip mounted on the PCB when the USB connector 1 is assembled thereto.

According to the prior art, in case that assembly of the USB memory is completed, a test is performed using a testing computer about whether or not electrical characteristics is in a good state. For this, an operator had to determine whether or not electrical characteristics of the USB memory is inferior, by inspecting a result thereof after inserting the USB memory into the USB port of the testing computer in handwork.

However, in case of a conventional apparatus for testing a USB memory, since an operator has to test electrical characteristics thereof in handwork, there is a problem that productivity of a testing operation and reliability thereon are depreciated.

SUMMARY OF THE INVENTION

An object of the present invention is to provide an apparatus for testing a USB memory and a method thereof, capable of testing a plurality of USB memory devices automatically by inserting the same mounted on a shuttle into a test socket.

An apparatus for testing a USB memory device according to the present invention comprises a tray, loading/unloading picking means, a buffer device, a shuttle means, and a test board.

The tray horizontally moves by a tray transfer, with vertically elevating by a tray elevator in a state where a plurality of USB memory devices are mounted. Loading/Unloading picking means transfers a case of a plurality of USB memory devices mounted to the tray after vacuum absorbing the same using a first picker by moving toward an X axis and a Y axis by XY gantries and in case of vacuum absorption of the USB memory devices, senses a fastening direction of a USB connector using a change of vacuum pressure of a second picker. If a plurality of USB memory devices are sequentially transferred by the loading/unloading picking means and the USB connector thereof is mounted to be projected, shuttle means horizontally moves by a shuttle transfer in a state where the upper surface of a plurality of mounted USB memory devices is supported by a plunger. And a test board is mounted by a test socket comprising a plurality of USB ports enabling electrical connection in such a way that the projected USB connector is inserted into shuttle means horizontally moving by the shuttle transfer.

BRIEF DESCRIPTION OF THE DRAWINGS

FIG. 9b is a side view of FIG. 9a.

DETAILED DESCRIPTION OF THE PREFERRED EMBODIMENT

Hereinafter, the present invention will be in detail described with reference to the accompanying drawings.

Figure 2:
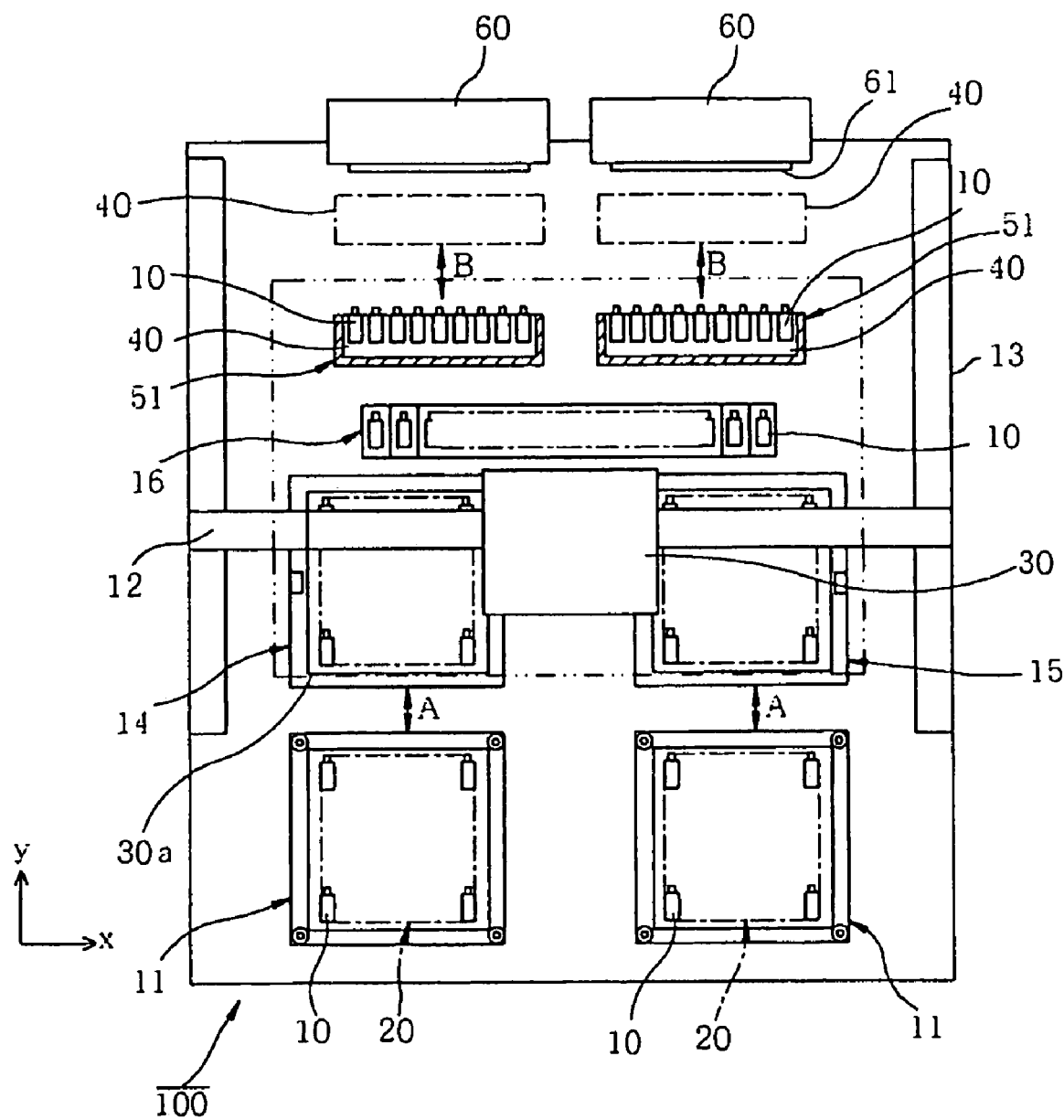
FIG. 2 is a plan view of an apparatus of a USB memory device according to the present invention.

FIG. 2 is a plan view of an apparatus for testing a USB memory device according to the present invention.

As illustrated in FIG. 2, The apparatus for testing a USB memory device comprises a tray 20 horizontally moving by a tray transfer (not illustrated), with vertically elevating by a tray elevator 11 in a state where a plurality of USB memory devices 10 are mounted; a loading/unloading picking means 30 transferring a plurality of USB memory devices 10 mounted to the tray 20 by vacuum absorbing the same using a first picker 31 (refer to FIG. 4) by moving toward an X axis and a Y axis by XY gantries 12 and 13 and in case of vacuum absorption of the USB memory devices 10, sensing a fastening direction of a USB connector 1 using a change of vacuum pressure of a second picker; a buffer device 16 for storing a failed USB memory device after testing the USB memory device 10 and an inversed USB memory device to the fastening direction of the USB connecter 1; a shuttle means 40 horizontally moving by a shuttle transfer 51 in a state where the upper surface of a plurality of mounted USB memory devices 10 is supported by a plunger 53 (shown in FIG. 8); and a test board 60 mounted by a test socket 61 (shown in FIG. 8) comprising a plurality of USB ports 61a (shown in FIG. 8) enabling electrical connection in such a way that the projected USB connector 1 is inserted into the shuttle means 40 horizontally moving by the shuttle transfer 51.

Figure 3:
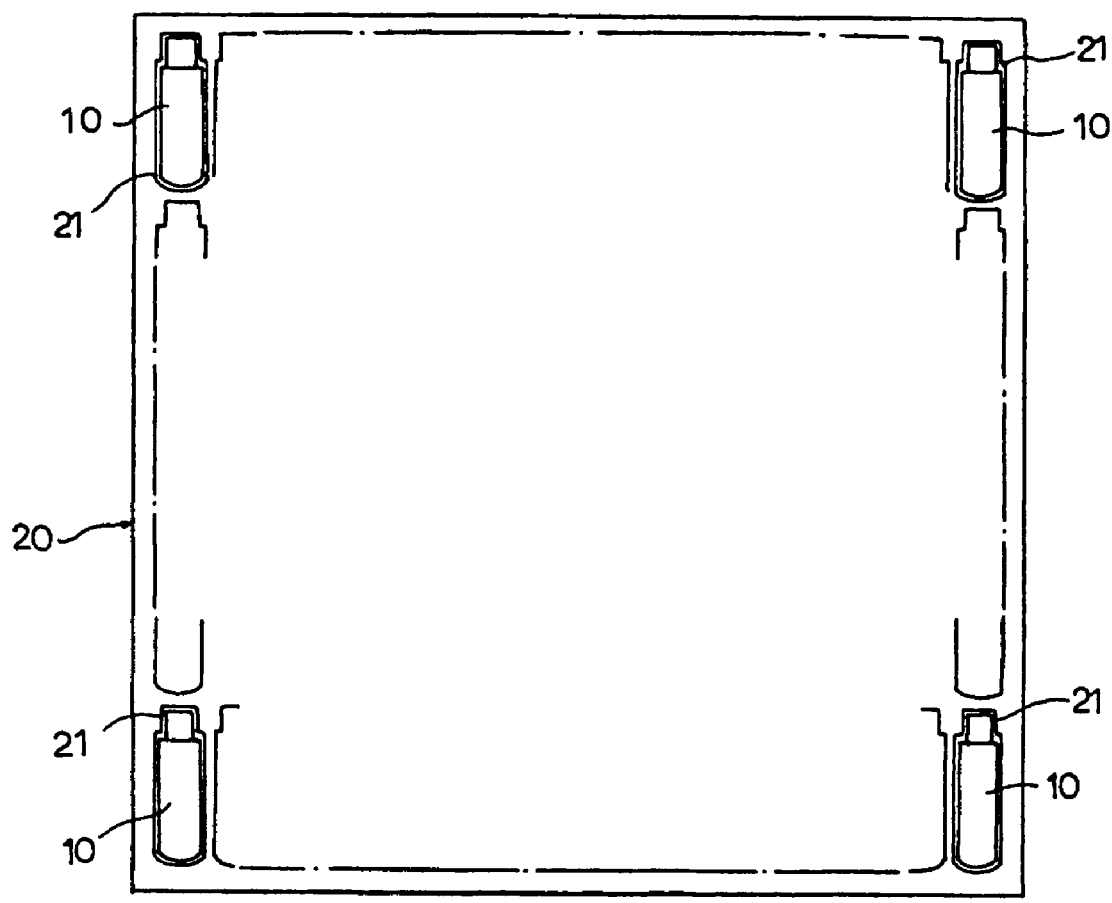
FIG. 3 is a plan view of a tray illustrated in FIG. 2.

As illustrated in FIGS. 2 and 3, the tray 20 is configured so that a plurality of USB memory devices 10 may be mounted thereinside and the tray 20 is configured to be horizontally transferable by a tray transfer (not illustrated) with vertically elevating by the tray elevator 11. As illustrated in FIG. 3, a plurality of first fastening slots 21 are formed spaced apart by a predetermined interval inside of the tray 20 so that the USB memory devices 10 may not be fell off during a transfer thereof.

The tray elevator 11 elevates the tray 20 vertically, i.e. the tray 20 into the upper and lower directions, and transfers the tray 20 horizontally, i.e. the tray 20 into a direction of Y axis directed by 'A' arrow, as illustrated in FIG. 2. Herein, the tray elevator 11 and the tray transfer(not shown) are configured to be able to elevate the tray 20 in an apparatus or transfer the same 20 into a horizontal direction.

Moreover, a tray loader 14 loading the tray 20 is provided at a predetermined location where the tray 20 is transferred by the tray transfer. On the contrary, a tray unloader 15 unloading the tray 20 is provided at an opposite location to the tray loader 14.

A buffer device 16 for storing USB memory devices 10 is provided at an opposite location to the tray loader 14 and the tray unloader 15, spaced apart by a predetermined interval.

Figure 4:
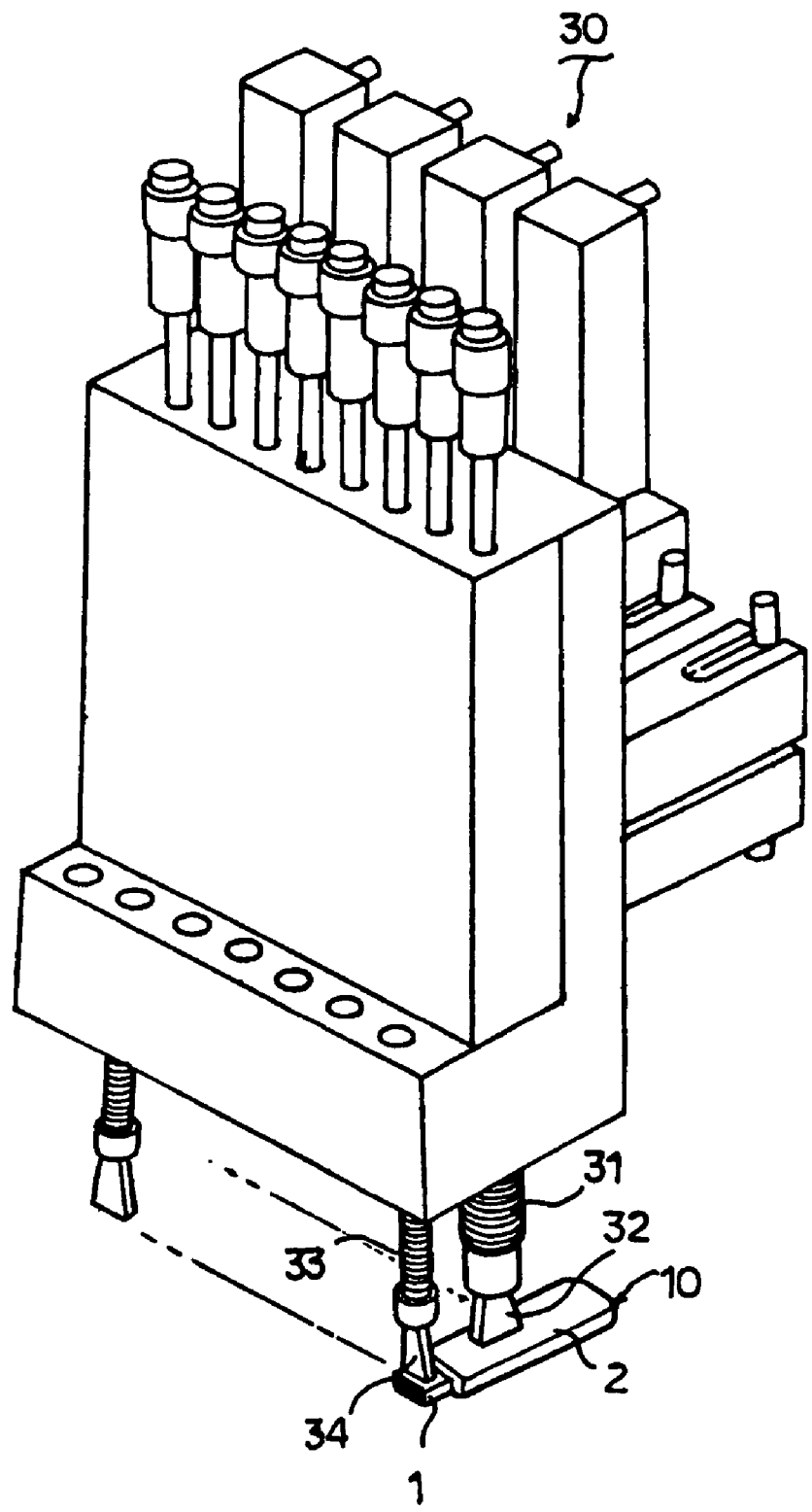
FIG. 4 is a perspective view of a loading/unloading picker illustrated in FIG. 2.
Figure 5A:
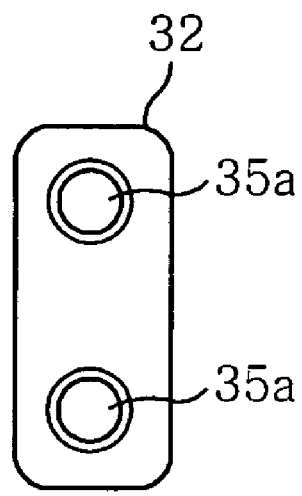
FIGS. 5a and 5b are bottom views of a nozzle illustrating another embodiments of a nozzle illustrated in FIG. 4, respectively.
Figure 5B:
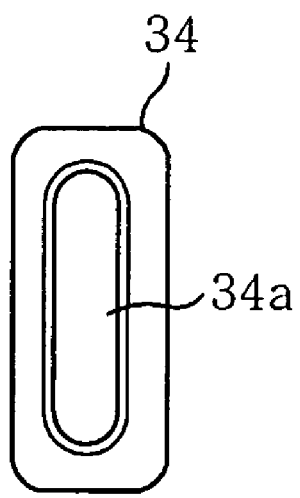

In the meantime, as illustrated in FIGS. 2 and 4, the loading/unloading picking means 30 is mounted on one surface of XY gantries 12 and 13, and equipped with a first picker 31 and a second picker 33 in order to pick and place the USB memory devices 10. In addition, the loading/unloading picking means 30 is transferable into both X and Y axes within an area drawn by two dotted lines 30a as illustrated in FIG. 2.

A plurality of the first pickers 31 are provided spaced apart by a predetermined interval and enabled to vacuum-absorb a case 2 of a plurality of USB memory devices 10. In addition, a plurality of the second pickers 33 are also provided spaced apart by a predetermined interval and enabled to vacuum-absorb the connector 1 of a plurality of USB memory devices 10.

Moreover, the first and the second pickers 31 and 33 maintain a predetermined interval in order to absorb the case 2 of a plurality of memory devices 10 and the USB connector 1 thereof respectively, and are respectively equipped with first and second nozzles 32 and 34.

A fastening direction of the USB connector 1 is sensed using a change of vacuum pressure, absorbed by the second nozzle 34 of the second picker 33. Namely, the vacuum pressure is different between in case that the USB connector 1 is normally fastened and in case that the same is inverse, whereby it is possible to confirm a fastening state of the USB connector 1. Herein, a vacuum pressure sensor and a control unit (both not illustrated) are used in order to measure vacuum pressure through the second nozzle 34.

The first nozzle 32 is fastened to one end of the first picker 31 and a plurality of holes 35a (refer to 5a) are formed thereinside. The second nozzle 34 is fastened to one end of the second picker 33 and a longitudinal hole 34a (refer to 5b) is formed thereinside.

In addition, it is possible to adopt an image senor 36 sensing a fastening direction of the USB connector 1, by using a light image reflected off after investigation of light with the USB connector 1 instead of the second picker 33.

Figure 6:
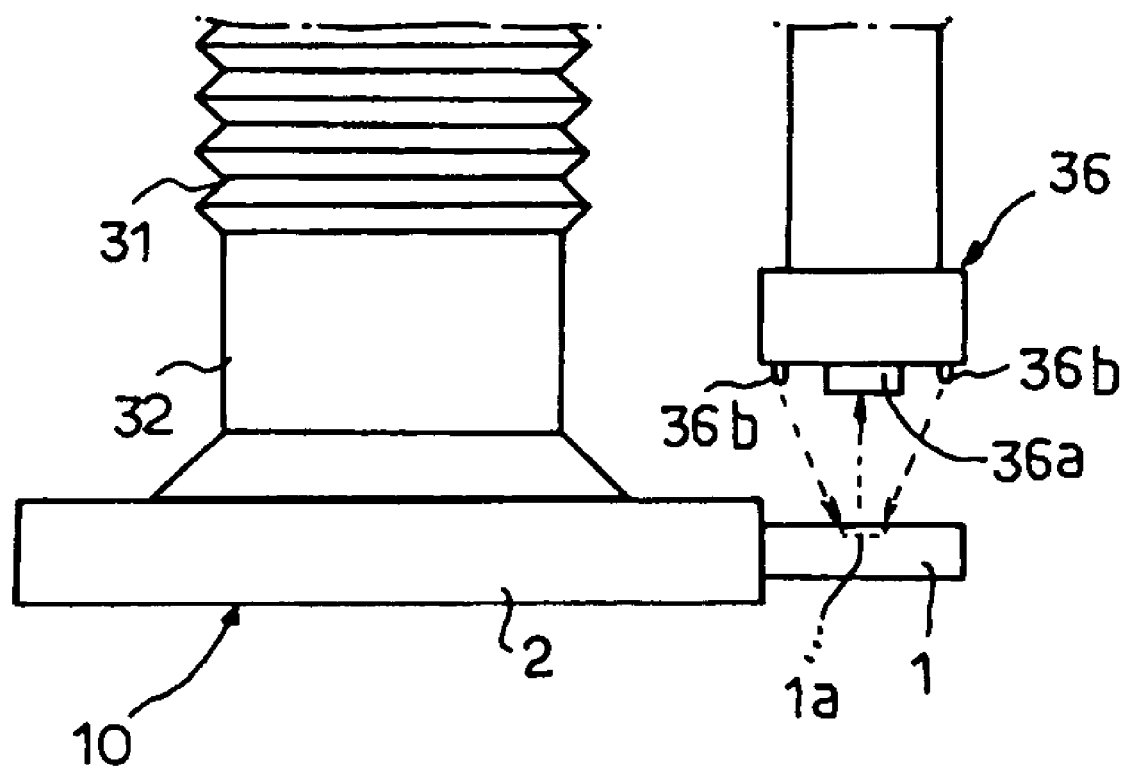
FIG. 6 is a side view illustrating another embodiment of a picker for sensing an inverse state of a USB memory device illustrated in FIG. 4.

As illustrated in FIG. 6, the image sensor 36 illuminates light coming from an illuminating device 36b by using the USB connector 1 and senses a fastening direction of the USB connector 1 by receiving a light image from a vision device 36a formed on one surface of the illuminating device 36b, wherein the light image is formed in such a way that the inspected light is reflected off. Herein, a camera is adopted for the vision device 36a and an illuminating diode is adopted for the illuminating device 36b.

Figure 7:
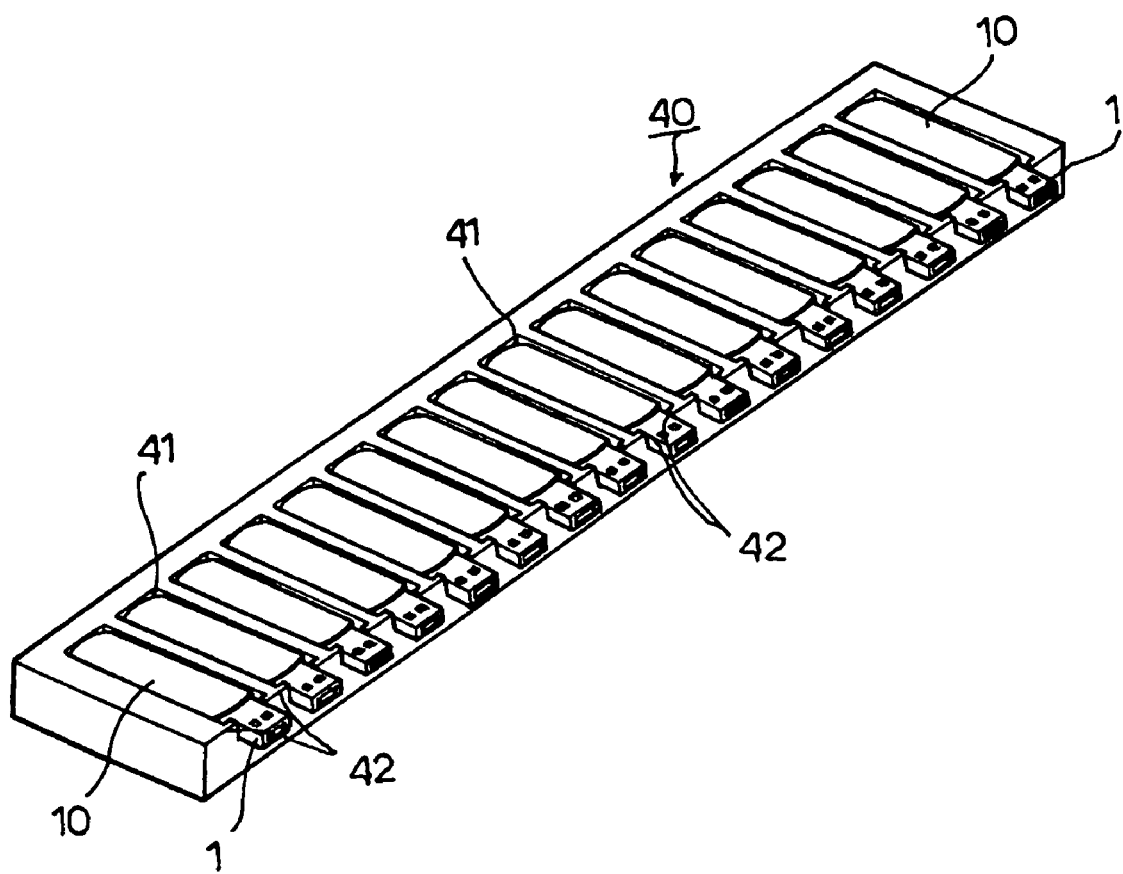
FIG. 7 is a perspective view of a shuttle illustrated in FIG. 2.

As illustrated in FIG. 7, a plurality of second fastening slots 41 are formed spaced apart by a predetermined interval on one surface of shuttle means 40 so that the USB memory devices 10 may not be fell off during a transfer thereof, and a plurality of fastening projections 42 are formed spaced apart by a predetermined interval on other surface thereof.

In the meantime, in order to support the USB memory devices 10 more firmly, a plunger 53 (illustrated in FIG. 8) capable of supporting the upper surface of a plurality of USB memory devices 10 is formed on the upper and lower part. If a plurality of USB memory devices 10 fastened to the shuttle means 40 are transferred to a test board 60 in a state where the same 10 is supported by the plunger 53, they are electrically connected in such a way that the USB connector 1 is inserted into a plurality of USB ports 61a of a test socket 61 fastened to the test board 60. At this time, electrical characteristics of the USB memory 10 is inspected in the test board 10.

Figure 9A:
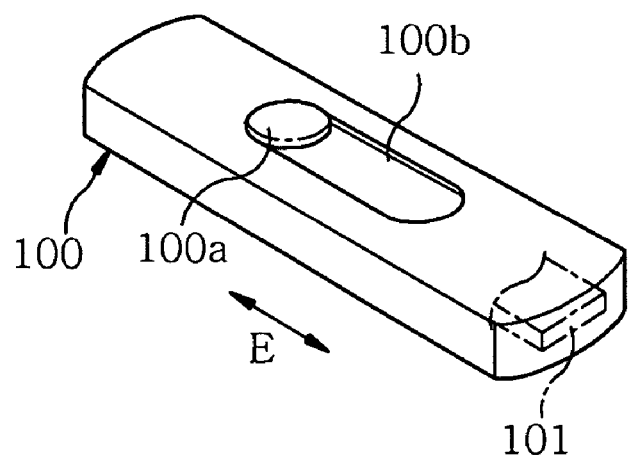
FIG. 9a is a perspective view illustrating another USB memory device.

In the meantime, FIG. 9a illustrates another embodiment of a USB memory 100. The USB memory device 100 comprises a knob 100a capable of transferring a USB connector 101 into a left and right directions in order to protect the same 101 and a guide slot 100b formed in length on a center of the USB memory 100. The knob 100a is configured to be transferable into an 'E' direction of an arrow along the guide slot 100b whereby the USB connector 101 is possible to be in-and-out to the outside.

Figure 9B:
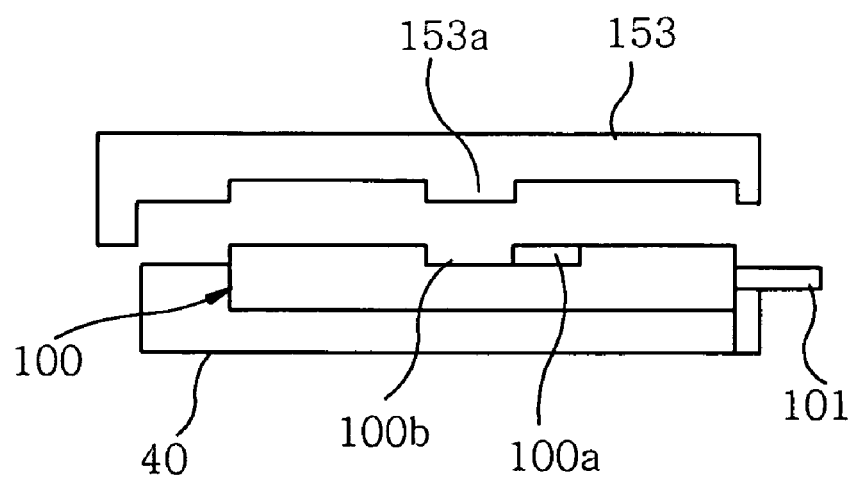

In addition, in case that the knob 100a is formed like above, a projection 153a for supporting the knob 100a is formed on one surface of a plunger 153 so that the USB connector 101 may be drawn out to the out side in the USB memory 100, as illustrated in FIG. 9b.

In the mean time, a method for testing a plurality of USB memory devices of the present invention will be described.

The method comprises the steps of providing a plurality of USB memory devices 10 to a tray 20; transferring the tray 20 to a loading position of the tray loader by tray transfer (not shown); transferring USB memory device stored at the tray 20 to shuttle means 40 by loading/unloading picking means 30; testing USB memory device 10 inserted at a USB port 61a of test socket 61 after transferring shuttle means 40 to test board by shuttle transferring device 51; moving shuttle means 40 with an inverse direction by shuttle transferring means 51 after completing the test of USB memory device 10; storing a failed USB memory device to a buffer device 16 and storing good USB memory device to a tray 20 located at loading position; unloading the tray 20 from tray unloader by the tray transfer.

In the step for providing USB memory device 10 to the tray 20, the tray 20 is mounted with multi-step at the tray elevator 11. Also, the tray 20 is moved at a loading position (that is, a remaining location of the tray loader 20) by the tray transfer(not shown).

The USB memory device 10 of the tray 20 is picked by loading/unloading picking means and an inversed and picked USB memory device among picked USB memory device is also stored at the buffer device 16. Also, a normal picked USB memory device is stored and mounted at the shuttle means 40.

That is, in the step of transferring USB memory device 10 stored at the tray 20 to shuttle means 40 by loading/unloading picking means 30, the step comprises the steps of storing an inversed and picked USB memory device among picked USB memory devices to a buffer device 16 by loading/unloading picking means; storing a normal picked USB memory device to shuttle means.

In the meantime, in the step of transferring USB memory device stored at the tray to shuttle means 40 by loading/unloading picking means, the step further comprising the step of, providing plunger 53 for preventing left of USB memory devices. When the plunger 53 returns to a position of the shuttle means 40 by shuttle transferring device 51 after completing the test of the USB memory device 10, the plunger 53 is removed.

Now, operation of apparatus for testing a USB memory of the present invention will be described.

First, if a plurality of USB memory devices 10 to be tested are mounted to the tray 20, the USB memory device 10 is stacked with a multistage by the tray elevator 11. The tray 20 drawn out from the tray elevator 11 is transferred to a side of the tray loader 12, a loading position, by the tray transfer (not illustrated). At this time, the tray loading position is where the tray loader 12 is located in FIG. 2.

If the tray 20 is transferred to the loading position, the first picker 31 of the loading/unloading picking means 30 and the second picker 33 thereof pick the predetermined number of the USB memory devices 10 and transfer the same to the shuttle means 40.

When the loading/unloading picking means 30 transfers the USB memory device 10, the first picker 31 absorbs the case 2 of the USB memory device 10 and the second picker 33 absorbs the USB connector 1. If the second picker 33 absorbs a plurality of holes 1a formed on both ends of the front surface of the USB connector 1, in absorbing the same 1, it is determined to be normally absorbed.

Figure 1:
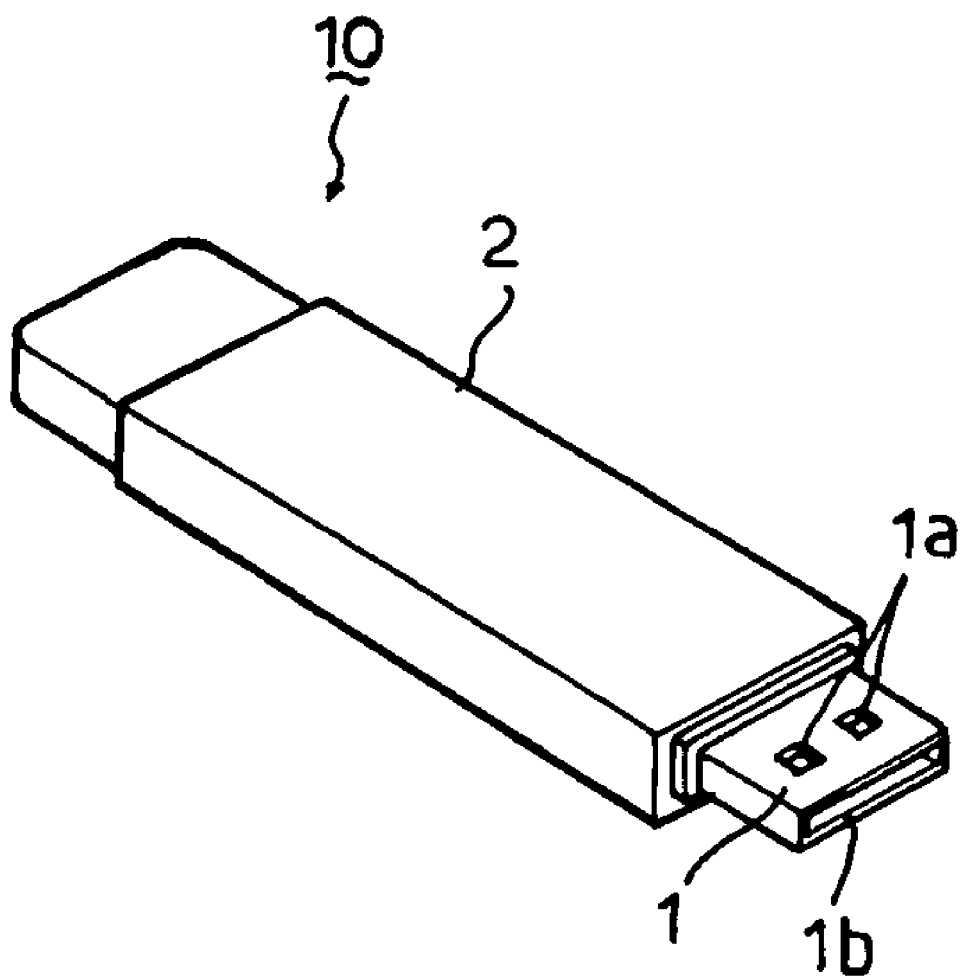
FIG. 1 is a perspective view illustrating a general USB memory device.

However, in case that the second picker 33 absorbs a plurality of holes (not shown) formed on both ends of the rear surface of the USB connector 1, blocked by the insulation member 1b (as shown in FIG. 1), it is determined to be an error since pressure of vacuum absorption is respectively different in comparison with the case of absorbing a plurality of holes formed on both ends of the front surface and an inverse direction of the USB memory 10 is absorbed.

That is, it is possible to determine whether or not a fastening direction of the USB memory device 10 is right based on a change of pressure of the USB connector 1 absorbed by the second picker 33. Herein, it is determined by a control unit (not illustrated) adopted in the apparatus 100 for testing a USB memory device 10. In addition, the USB memory device 10 of which fastening direction is not in a right state is transferred to the buffer 16 by the loading/unloading picking means 30.

Figure 8:
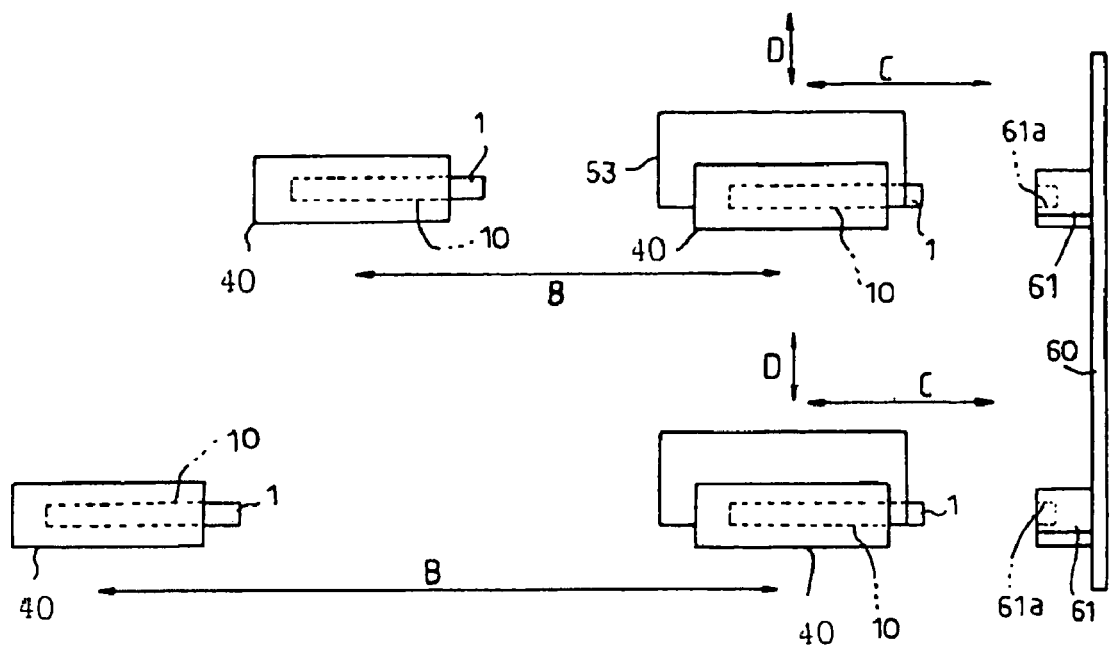
FIG. 8 is a side view of a test board and a shuttle illustrated in FIG. 2.

As illustrated in FIG. 8, when each of shuttle means 40 is transferred from arrows 'B' to 'C' by the shuttle transfer 51, the plunger 53 prevents the USB memory device 10 received inside the shuttle means 40 from falling off by supporting the upper surface thereof. In this state, the USB memory device 10 is tested in such a way that the USB connector 1 projected on one surface of the shuttle means 40 is inserted into the USB port 61a fastened to the test socket 61 of the test board 60.

If a test of the USB memory device 10 is completed, the shuttle means 40 is transferred to an opposite direction by the shuttle transfer 51. At this time, the USB memory device 10 having caused an error is classified into the buffer device 16 and other normal USB memory devices 10 are transferred to an unloading position where the tray unloader 15 is located, by the loading/unloading picking means 30. In addition, the tray 20 stored with normal USB memory devices 10 is removed after being transferred from the tray loader 15 to the tray elevator 11 by the tray transfer (not illustrated).

There is an advantage that it is possible to automatically test a plurality of USB memory devices more promptly and more precisely in such a way that a plurality of USB memory devices is transferred to a shuttle after transferring the tray receiving a plurality of USB memory devices to a tray loading position, and simultaneously inserted into a test socket.

What is claimed is:

1. A test handler for USB memory devices, the test handler comprising:
   a tray transfer mechanism that moves a tray holding a plurality of USB memory devices thereon into and out of a transfer area;
   a shuttle configured to hold a plurality of USB memory devices, to transport the plurality of USB memory devices from a loading area to a test socket to insert connectors of the USB memory devices into corresponding USB ports for testing, to remove the plurality of USB memory devices from the USB ports, and transport the plurality of USB memory devices back to the loading area; and
   a loading/unloading picker configured to pick up and transfer the plurality of USB memory devices from a first tray to the shuffle and from the shuffle to a second tray, wherein the loading/unloading picker is configured to exert a vacuum force on the USB memory devices so as to hold the USB memory devices.

2. The handler of claim 1, wherein the loading/unloading picker comprises at least one first nozzle and at least one second nozzle, wherein the at least one first nozzle is configured to exert a vacuux-n force on a casing of a corresponding USB memory device, and the at least one second nozzle is configured to exert a vacuum force on a connector of the corresponding USB memory device.

3. The handler of claim 2, wherein the loading/unloading picker is configured to detect an orientation of a USB memory device held by the picker based on a detected vacuum pressure in the second nozzle.

4. The handler of claim 3, further comprising a buffer configured to receive improperly oriented USB memory devices.

5. The handler of claim 3, further comprising a buffer configured to receive USB memory devices that fail a test.

6. The handler of claim 1, wherein the shuttle includes a plurality of slots formed at predetermined intervals along an upper surface thereof, wherein the plurality of slots are configured to receive the plurality of USB memory devices therein.

7. The handler of claim 6, wherein the shuttle further comprises a plunger which supports upper surfaces of the plurality of USB memory devices mounted in the plurality of slots formed in the shuffle.

8. The handler of claim 7, wherein the plunger comprises a plurality of projections formed on a surface thereof which contacts the upper surfaces of the plurality of USB memory devices, wherein the projections are configured to move a knob provided on an upper surface of the USB memory device to extend and retract the connector from the case of the USB memory device.

9. The handler of claim 1, wherein the loading/unloading picker comprises a nozzle configured to exert a vacuum force on a casing of a corresponding USB memory device so as to hold the corresponding USB memory device, and an image sensor configured to detect an orientation of the corresponding USB memory device.

10. The handler of claim 9, wherein the image sensor comprises:
   an illuminating device positioned to a side of the nozzle and configured to direct light onto the connector of the corresponding USB memory device held by the nozzle; and an imaging device configured to detect an orientation of the corresponding USB memory device held by the picker based on a detected image of the connector of the USB memory device.

11. A test handler for USB memory devices, the test handler comprising:

a picker configured to move USB memory devices from a first tray to a shuffle, and from the shuttle to a second tray, wherein the picker includes a holding nozzle that exerts a vacuum force USB memory devices so as to transport the USB memory devices; and an orientation detector configured to detect an orientation of the USB memory devices when they are held by the picker.

12. The handler of claim 11, wherein the orientation detector comprises:

an orientation detecting nozzle configured to exert a vacuum force on a connector of a USB memory device held by the picker; and a control unit configured to detect an orientation of the connector based on a detected vacuum pressure of the orientation detecting nozzle.

13. The handler of claim 11, wherein the orientation detector comprises an image sensor mounted on the picker and configured to detect an orientation of a USB memory device held by the picker based on an image of the USB memory device.

14. The handler of claim 13, wherein the image sensor detects an orientation of the USB memory device based on an image of the USB connector of the USB memory device.

15. The handler of claim 14, wherein the image sensor comprises:

an illuminating device positioned proximate the holding nozzle and configured to direct light toward a USB memory device held by the picker; and an imaging device configured to detect an image of the USB connector based on light reflected from the USB connector.

16. A method of handling a plurality of USB memory devices in a test handler, the method comprising:

transferring a first tray holding a plurality of USB memory devices to a loading position;

transferring the plurality of USB memory devices from the first tray to a shuffle;

moving the shuttle such that USB connectors of the plurality of USB memory devices are inserted into a corresponding plurality of USB ports formed in a test socket;

testing the plurality of USB memory devices;

moving the shuffle to remove the USB connectors of the plurality of USB memory devices from the corresponding plurality of USB ports when testing is complete; and transferring USB memory devices which have passed testing to a second tray.

17. The method of claim 16, further comprising transferring failed USB memory devices which have failed a test to a buffer.

18. The method of claim 16, wherein transferring the plurality of USB memory devices from the tray to a shuffle comprises:

picking up USB memory devices from the first tray with a picker;

detecting an orientation of the USB memory devices;

moving improperly oriented USB memory devices to a buffer; and transferring properly oriented USB memory devices to the shuffle.

19. The method of claim 18, wherein picking up USB memory devices comprises exerting a vacuum force through a holding nozzle of the picker onto a casing of each of the USB memory devices so as to pick up and hold the USB memory devices.

20. The method of claim 18, wherein detecting an orientation of each of the USB memory devices comprises:

exerting a vacuum force through an orientation detecting nozzle onto the connectors of each of the USB memory devices; and detecting an orientation of the USB memory devices based on a detected vacuum pressure in the orientation detecting nozzle.

21. The method of claim 18, wherein detecting an orientation of each of the USB memory device comprises:

detecting an image of each of the USB connectors of the USB memory devices held by the picker; and detecting an orientation of each of the USB memory devices based on the detected images of the USB connectors.

* * * * *